United States Patent
Kim et al.

(10) Patent No.: US 11,637,473 B2
(45) Date of Patent: Apr. 25, 2023

(54) SEAT VENTILATION BLOWER AND SEAT VENTILATION SYSTEM HAVING THE SAME

(71) Applicants: Hyundai Motor Company, Seoul (KR); Kia Motors Corporation, Seoul (KR); INZICONTROLS CO., LTD., Gyeonggi-do (KR); Hyundai Transys Inc., Chungcheongnam-do (KR)

(72) Inventors: Ju-Hyun Kim, Gyeonggi-do (KR); Sang-Uk Yu, Seoul (KR); Doo-Ri Kim, Gyeonggi-do (KR); Yo-Han Kim, Gyeonggi-do (KR); Byung-Jae Lee, Gyeonggi-do (KR); Byung-Yong Choi, Gyeonggi-do (KR); Seon-Chae Na, Gyeonggi-do (KR); Ho-Sub Lim, Seoul (KR); Jin-Hyuk Kim, Gyeonggi-do (KR); Young-Dae Hong, Incheon (KR); You-Jeong Jeong, Gyeonggi-do (KR); Sang-Kyung Koh, Gyeonggi-do (KR)

(73) Assignees: Hyundai Motor Company, Seoul (KR); Kia Motors Corporation, Seoul (KR); INZICONTROLS CO., LTD., Gyeonggi-do (KR); Hyundai Transys Inc., Chungcheongnam-do (KR)

( * ) Notice: Subject to any disclaimer, the term of this patent is extended or adjusted under 35 U.S.C. 154(b) by 596 days.

(21) Appl. No.: 16/691,106

(22) Filed: Nov. 21, 2019

(65) Prior Publication Data
US 2020/0282881 A1    Sep. 10, 2020

(30) Foreign Application Priority Data
Mar. 5, 2019  (KR) ......................... 10-2019-0025365

(51) Int. Cl.
*H02K 5/20* (2006.01)
*H02K 11/33* (2016.01)
(Continued)

(52) U.S. Cl.
CPC ............... *H02K 5/207* (2021.01); *H02K 7/14* (2013.01); *H02K 11/33* (2016.01); *H05K 1/0209* (2013.01);
(Continued)

(58) Field of Classification Search
CPC ........ B60H 1/00828; H02K 9/00; H02K 9/02; H02K 9/04; H02K 9/06; H02K 9/10;
(Continued)

(56) References Cited

U.S. PATENT DOCUMENTS 6,719,534 B2 * 4/2004 Aoki .................. B60H 1/00457
                                                         417/44.1
9,121,414 B2 * 9/2015 Lofy ....................... F04D 25/08
(Continued)

FOREIGN PATENT DOCUMENTS

KR        20090021934 A  *  8/2009
KR     10-2013-0053470 A     5/2013
(Continued)

OTHER PUBLICATIONS

Jang et al, Motor Module for Ventilated Seat in Vehicle, Feb. 28, 2019, CNM Co. LTD, WO 2019039845 (English Machine Translation) (Year: 2019).*
(Continued)

*Primary Examiner* — Alexander A Singh
(74) *Attorney, Agent, or Firm* — Fox Rothschild LLP

(57) ABSTRACT

A seat ventilation blower may include a first housing; a second housing coupled and assembled to the first housing; an impeller inserted inside the first housing or the second housing, the impeller configured to rotate; and a circuit
(Continued)

board body having a motor assembly coupled to the impeller to rotate the impeller wherein the circuit board body is configured to control operation of the motor assembly and installed in the housing when the first and second housings are coupled and assembled together.

18 Claims, 7 Drawing Sheets

(51) Int. Cl.
*H05K 1/02* (2006.01)
*H05K 7/20* (2006.01)
*H02K 7/14* (2006.01)
*B60N 2/56* (2006.01)
*H05K 1/18* (2006.01)

(52) U.S. Cl.
CPC ........ *H05K 7/20909* (2013.01); *B60N 2/5621* (2013.01); *B60N 2/5685* (2013.01); *H02K 2205/09* (2013.01); *H02K 2211/03* (2013.01); *H05K 1/18* (2013.01)

(58) Field of Classification Search
CPC .. H02K 9/12; H02K 9/14; H02K 9/18; H02K 9/19; H02K 9/193; H02K 9/197; H02K 9/20; H02K 9/22; H02K 9/223; H02K 9/225; H02K 9/27; H02K 9/24; H02K 7/14; H02K 5/20; H02K 5/207; H02K 11/33; H02K 2205/09; H02K 2211/03; H02K 11/30; B60N 2/56; B60N 2/5621; B60N 2/5657; B60N 2/5685; B60N 2/565; H05K 1/0209; H05K 7/20909; H05K 2201/1009; H05K 1/18; H05K 2201/09027; H05K 1/0206
USPC ..... 310/52, 53, 54, 55, 56, 58, 59, 60 R, 61, 310/62, 63, 60 A, 64, 68 R
See application file for complete search history.

(56) References Cited

U.S. PATENT DOCUMENTS

| | | | | |
|---|---|---|---|---|
| 2008/0219838 | A1* | 9/2008 | Kusano | F01D 1/02 415/203 |
| 2012/0114512 | A1* | 5/2012 | Lofy | F04D 25/068 417/410.1 |
| 2017/0146033 | A1* | 5/2017 | Pacilli | F04D 29/668 |
| 2018/0091071 | A1* | 3/2018 | Gao | H02P 6/14 |
| 2019/0101132 | A1* | 4/2019 | Fujiwara | F04D 25/08 |
| 2019/0159640 | A1* | 5/2019 | Hayamitsu | H02K 11/33 |

FOREIGN PATENT DOCUMENTS

| | | | | |
|---|---|---|---|---|
| KR | 10-2013-0056448 A | | 5/2013 | |
| WO | WO-2018173942 A1 | * | 9/2018 | ............... F28F 7/02 |
| WO | WO-2019039845 A1 | * | 2/2019 | ............... B60N 2/56 |

OTHER PUBLICATIONS

Sasaki Beji, Cooling Structure Cooling System Heating Device and Structural Object, Sep. 27, 2018, Freesia Macross Corporation, WO 2018173942 (English Machine Translation) (Year: 2018).*
Kim et al, Brushless DC Motor, Mar. 4, 2009, KR 20090021934 (English Machine Translation) (Year: 2009).*

* cited by examiner

SEAT VENTILATION BLOWER AND SEAT VENTILATION SYSTEM HAVING THE SAME

CROSS-REFERENCE TO RELATED APPLICATION

This application claims under 35 U.S.C. § 119(a) the benefit of Korean Patent Application No. 10-2019-0025365, filed on Mar. 5, 2019, the entire contents of which are incorporated herein by reference.

BACKGROUND

(a) Technical Field

The present disclosure relates to a blower, more particularly, to a seat ventilation blower for a vehicle, in which a control function is integrated into the seat ventilation blower without a separate space for the control function, and a seat ventilation system having the seat ventilation blower.

(b) Description of the Related Art

Generally, a system for ventilating a seat for a vehicle is separated into a blower for generating wind by direct control of an electric motor, and a controller for controlling the blower by receiving an operation signal of an occupant.

In this case, the controller and a control circuit for controlling the motor in the blower are separately configured on respective printed circuit boards. Therefore, there is a problem that due to the cost for developing the controller and the control circuit independently, the overall cost for developing a seat is increased.

Moreover, there is a problem that since the controller and the blower are constituted as separate units, space utilization of a vehicle seat is also deteriorated.

SUMMARY

An object of the present disclosure is to provide a seat ventilation blower for a vehicle, in which a control function is integrated into the seat ventilation blower without requiring a separate controller.

Further, another object of the present disclosure is to provide a seat ventilation blower and a seat ventilation system having the seat ventilation blower that make it possible to reduce the manufacturing cost of the ventilation system and/or simplify the manufacturing process.

Yet another object of the present disclosure is to provide the seat ventilation blower and the seat ventilation system having the seat ventilation blower that are capable of increasing space utilization of a vehicle seat.

Other objects and advantages of the present disclosure can be understood by the following description and become apparent with reference to the embodiments of the present disclosure. Also, it is obvious to those skilled in the art to which the present disclosure pertains that the objects and advantages of the present disclosure can be realized by the means as claimed and combinations thereof.

In accordance with one aspect of the present disclosure for accomplishing the objects as described above, there is provided a seat ventilation blower for a vehicle, in which control function is integrated without a separate controller.

The seat ventilation blower comprises: a first housing; a second housing coupled and assembled to the first housing; an impeller inserted inside the first housing or the second housing, the impeller configured to rotate; and a circuit board body having a motor assembly coupled to the impeller to rotate the impeller, wherein the circuit board body is configured to control operation of the motor assembly and installed in the housing when the first and second housings are coupled and assembled together.

Further, the seat ventilation blower is characterized in that an exothermic element mounted on the circuit board body is arranged between the housing and a position out of a range of blades of the impeller to be cooled.

Further, the seat ventilation blower is characterized in that a heat dissipation pattern for cooling heat dissipation of the exothermic element is formed on one side or both sides of the circuit board body.

Further, the seat ventilation blower is characterized in that the heat dissipation pattern is formed with at least one plating hole.

Further, the seat ventilation blower is characterized in that a total area of the plating hole is calculated based on a diameter of the plating hole and a thickness of the circuit board body.

Further, the seat ventilation blower is characterized in that an area of the heat dissipation pattern is calculated based on a heat transfer performance value set in advance depending on a type of a circuit board of the circuit board body.

Further, the seat ventilation blower is characterized in that the exothermic element is a specific electronic element of which heat dissipation amount to be preset is highest among electronic elements installed on the circuit board body.

Further, the seat ventilation blower is characterized in that an air intake port for sucking air is formed on the top side of the first housing or the second housing.

Further, the seat ventilation blower is characterized in that a plurality of air discharge ports for discharging air are formed on the lateral side of the first housing or the second housing, the air discharge ports being defined when lower and upper housings are assembled together.

Further, the seat ventilation blower is characterized in that a column portion for fixing the circuit board body is formed on the center of the first housing or the second housing.

Further, the seat ventilation blower is characterized in that the column portion is formed with a catching projection having a stepped portion for fixing the circuit board body at a predetermined height.

Further, the seat ventilation blower is characterized in that the impeller is provided with an annular ring and a disk plate which are arranged in parallel wherein a plurality of blades are arranged to be inclined at a predetermined interval with respect to each other around a rotating shaft and between the annular ring and the disk plate.

Further, the seat ventilation blower is characterized in that the circuit board body comprises a microcontroller unit for generating an on/off control signal in an input signal to control turning on/off a motor of the motor assembly; and a motor control circuit for turning on/off the motor in response to the on/off control signal.

Further, the seat ventilation blower is characterized in that the motor control circuit comprises a single large current switch element for turning on/off a motor power supply for supplying power to the motor.

Further, the seat ventilation blower is characterized in that the motor control circuit comprises a small signal switch for turning on/off electric current to be input to a base of the large current switch element.

Further, the seat ventilation blower is characterized in that the motor control circuit comprises a Zener diode for cutting off voltage to be input to a base of the large current switch element to generate Zener voltage.

Further, the seat ventilation blower is characterized in that the motor power supply is of voltage equal to value obtained by subtracting voltage of the large current switch element from the Zener voltage.

Further, the seat ventilation blower is characterized in that the first housing and the second housing are assembled and fixed by a bolting.

On the other hand, in accordance with another aspect of the present disclosure, there is provided a seat ventilation system for a vehicle comprising an on-off switch; a seat ventilation blower as described above; a front duct installed at a front end of the seat ventilation blower; and a back duct installed at a rear end of the seat ventilation blower.

According to the present disclosure, it is possible to add a control function to a printed circuit board for controlling a motor without providing the blower with a separate space for the control function.

In addition, another effect of the present disclosure is that cost, weight and the number of components of a seat ventilation system for a vehicle are reduced because common use or reduction of wiring, casing and various components are realized by integrating a controller and a blower which were separately provided in the seat ventilation system in the prior art.

Further, another effect of the present disclosure is that space utilization at the lower end of the vehicle seat is increased because an external type integrated controller and wiring are eliminated.

Further, yet another effect of the present disclosure is that manufacturing cost can be reduced because manufacturing process for manufacturing the ventilation system is simplified.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The above and other objects, features and other advantages of the present disclosure will be more clearly understood from the following detailed description taken in conjunction with the accompanying drawings, in which.

DESCRIPTION OF SPECIFIC EMBODIMENTS

Figure 1:
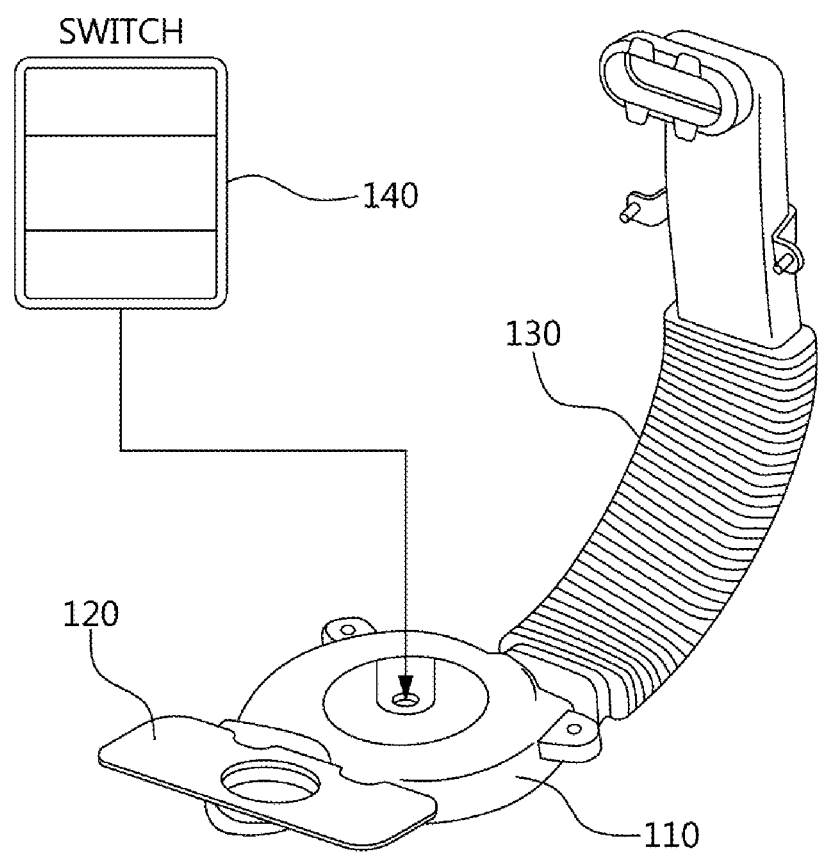
FIG. 1 is a block diagram of a seat ventilation system for a vehicle according to an embodiment of the present disclosure.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Throughout the specification, unless explicitly described to the contrary, the word "comprise" and variations such as "comprises" or "comprising" will be understood to imply the inclusion of stated elements but not the exclusion of any other elements. In addition, the terms "unit", "-er", "-or", and "module" described in the specification mean units for processing at least one function and operation, and can be implemented by hardware components or software components and combinations thereof.

Further, the control logic of the present disclosure may be embodied as non-transitory computer readable media on a computer readable medium containing executable program instructions executed by a processor, controller or the like. Examples of computer readable media include, but are not limited to, ROM, RAM, compact disc (CD)-ROMs, magnetic tapes, floppy disks, flash drives, smart cards and optical data storage devices. The computer readable medium can also be distributed in network coupled computer systems so that the computer readable media is stored and executed in a distributed fashion, e.g., by a telematics server or a Controller Area Network (CAN).

The present disclosure may be implemented in many altered forms and have various embodiments. Therefore, an exemplary specific embodiment is illustrated in the drawings and described in detail in the following description. However, the disclosure herein is not intended to limit the present disclosure to a specific embodiment and should be understood as covering all modifications, equivalents and substitutions falling within the spirit and scope of the disclosure.

Like reference numerals are used to designate like elements throughout the drawings and the description with reference to the drawings. Although the terms "first," "second," etc. may be used herein to describe various components, these components should not be limited by these terms. These terms are used merely to distinguish one element from another.

For example, a first component may be designated as a second component and similarly a second component may be designated as a first component without departing from the scope of the present disclosure.

All terms including technical or scientific terms, unless being defined otherwise, have the same meaning generally understood by a person having ordinary skill in the art pertaining to the present disclosure.

The terms that are the same as the ones defined in a commonly-used dictionary should be interpreted as including the meaning consistent with the meaning in the context of the related art and should not be interpreted as being ideally or excessively formal meaning unless they are explicitly defined otherwise herein.

Hereinafter, a seat ventilation blower and a seat ventilation system having the seat ventilation blower according to an embodiment of the present disclosure will be described in detail with reference to the accompanying drawings.

FIG. 1 is a block diagram of a seat ventilation system 100 for a vehicle according to an embodiment of the present disclosure. Referring to FIG. 1, the seat ventilation system includes a blower 110, a front duct 120 installed at a front end of the blower 110, a back duct 130 installed at a rear end of the blower 110, a switch 140 for turning on/off the blower 110 and the like.

The switch 140 may be a toggle switch, a push switch, a micro switch, a proximity switch, or the like. It is natural that in addition to these physical switches, a soft switch constituted only by software may also be used. The soft switch may be of a button type in which a switch is displayed on a touch screen, or a voice input type in which voice is input through a microphone.

Figure 2:
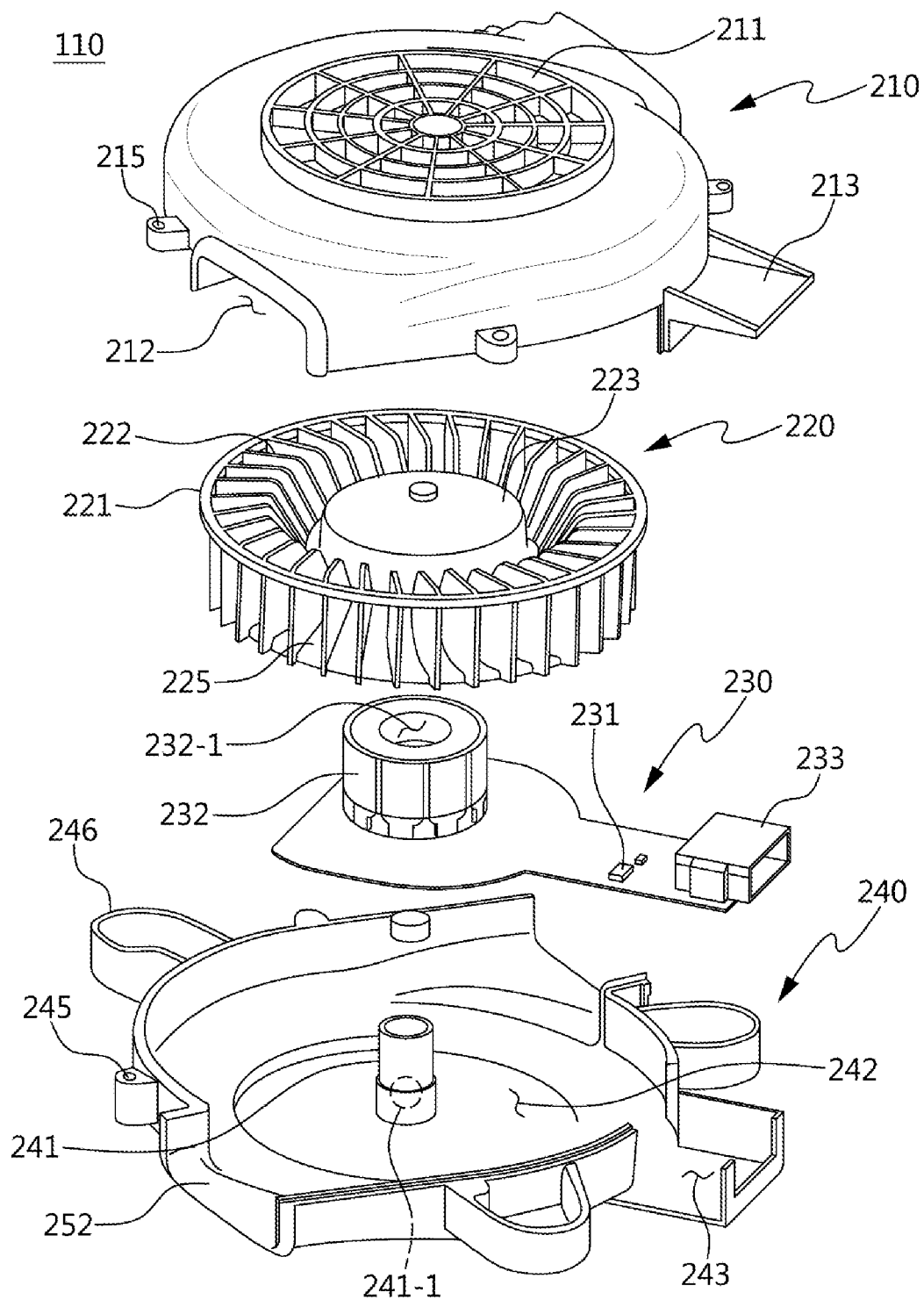
FIG. 2 is an exploded view of the blower shown in FIG. 1.

FIG. 2 is an exploded view of the blower 110 shown in FIG. 1. Referring to FIG. 2, the blower 110 includes an upper housing 210, an impeller 220 inserted inside the upper housing 210, a circuit board body 230 coupled to the impeller 220 to rotate the impeller 220, a lower housing 240 which allows the circuit board body 230 to be fixed thereto and is coupled to the upper housing 210, and the like.

The upper housing 210 is formed with an air intake port 211 for sucking air and air discharge ports 212 and 252 for discharging air that are defined at front and rear sides of the housing when the upper housing is assembled to the lower housing 240. The air intake port 211 may have a spider web pattern but not limited thereto.

In addition, the air discharge ports 212 and 252 are composed of a first sub-air discharge port 212 and a second sub-air discharge port 252. In other words, the first sub-air discharge port 212 is formed in the upper housing 210 while the second sub-air discharge port 252 is formed in the lower housing 240. Therefore, both the air discharge ports 212 and 252 are defined when the upper housing 210 and the lower housing 240 are assembled together.

In addition, first fastening portions 215 for assembling and fastening the upper housing to the lower housing 240 are formed at the outer and inner sides of an edge of the upper housing 210. A bolting method may be utilized in assembling and fastening the housings. It is illustrated in FIG. 2 that the housings are fastened by means of, but not limited to, screw bolts. It is also possible to use a bolt and a nut to fasten the housings.

In addition, one side of the upper housing 210 is formed with a cover 213 to cover and fix a terminal portion 233 formed at the front end of the circuit board body 230. The cover 213 is formed to have a "F" shaped cross section, which is bent at 90 degrees for occlusion. In other words, it serves to prevent dust or the like from being introduced into the inside.

The impeller 110 rotates according to rotation of a motor assembly 232 to provide airflow. In other words, the impeller 110 is an apparatus for supplying airflow in a direction perpendicular to its shaft by means of rotation of blades to be rotated by rotation of the shaft. To this end, the impeller 110 is provided with an annular ring 221 and a disk plate 225 which are arranged in parallel wherein a plurality of blades 222 are arranged to be inclined (at an angle of approximately 10 to 35°) at a predetermined interval (approximately 1 to 3 cm) with respect to each other around a rotating shaft 223. Diameters of the annular ring 221 and the disk plate 225 are different from each other. That is, the diameter of the annular ring 221 arranged at the top side of the impeller is larger than that of the disk plate 225 arranged at the bottom side of the impeller. It is natural that embodiments of the present disclosure are not limited to the shape of the impeller 110 shown in FIG. 2 and can adopt various other shapes.

The circuit board body 230 is assembled with the rotating shaft 223 and functions to rotate the impeller 110. To this end, the circuit board body is composed of various electronic elements and the motor assembly 232. Further, the circuit board body 230 function to control the motor assembly 232 in response to an instruction signal of a user. The electronic elements include, inter alia, an exothermic element 231 which generates heat dissipation such that the motor assembly 232 can be normally driven. Examples of the exothermic element include a power semiconductor, a microprocessor and the like.

The terminal portion 233 is formed at one end of the circuit board body 230. The terminal portion 233 is connected to a connector (not shown). Communication connection, power connection, etc. can be made by means of such connector.

Further, the motor assembly 232 is formed with a hollow hole 232-1. The hollow hole 232-1 is engaged with a column portion 241 formed on the lower housing 240. In other words, the column portion 241 is inserted into the hollow hole 232-1.

Referring to FIG. 2, an internal space 242 is formed in the lower housing 240 and the column portion 241 is formed at the center of the internal space. Further, the column portion is formed with a catching projection 241-1 having a stepped portion for fixing the circuit board body 230 at a predetermined height. A recessed channel 243 is formed to protrude from a lateral side of the lower housing 240 so as to be aligned with the cover 213 formed to protrude from the lateral side of the upper housing 210.

The terminal portion 233 of the circuit board body 230 is inserted into the recessed channel 243 and the cover 213 of the upper housing 210 covers the rear and top portions of the terminal portion 233. As a result, foreign matter is prevented from flowing into the blower. Of course, to this end, it is configured such that the bottom end face of the impeller 220 is closed by the disk plate 225.

The second fastening portions 245 are formed at the edge of the lower housing 240 so as to correspond to the first fastening portions 215 formed at the edge of the upper housing 210. Each of the second fastening portions 245 has a structure in which the bottom end is closed unlike the first fastening portions 215. It is natural that each of the second fastening portions 245 may also be of a through hole type in which both the top and bottom ends are perforated like the first fastening portions 215 such that the fastening portions can be fastened by a bolt and a nut.

Further, fixing claw portions 246 for fastening the blower 110 to one side of a vehicle seat (not shown) are formed on the edge of the lower housing 240. In FIG. 2, it is shown that three fixing claw portions 246 are arranged in a triangle. Of course, it is to be appreciated that this is illustrated by way of example and various other arrangements are possible.

Figure 3:
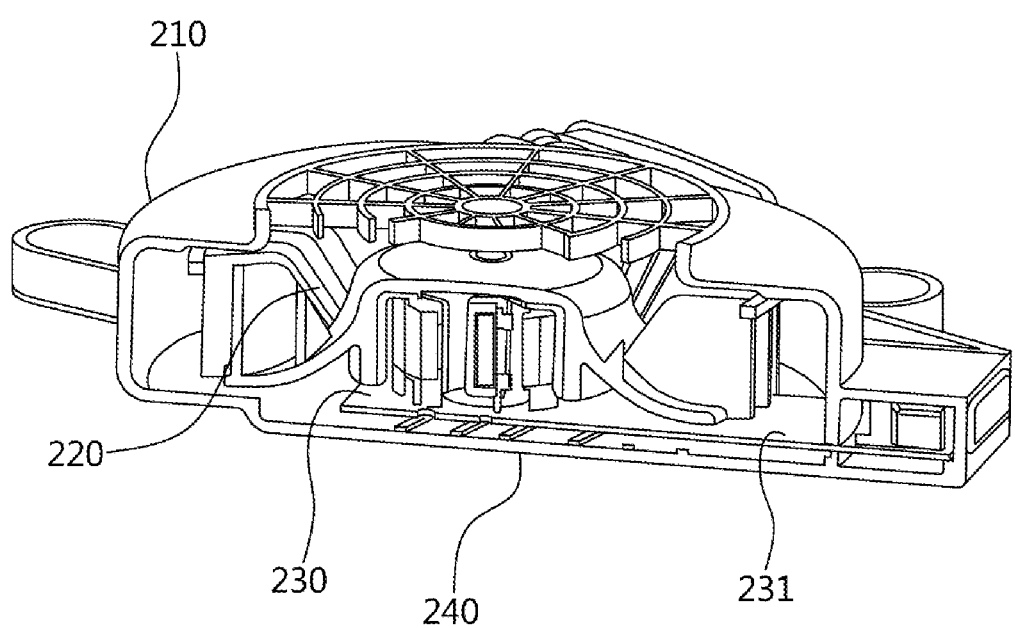
FIG. 3 is a cross-sectional perspective view of the blower shown in FIG. 1.

FIG. 3 is a cross-sectional perspective view of the blower 110 shown in FIG. 1. Referring to FIG. 3, the circuit board body 230 which serves to control operational function of the motor assembly 232 for rotating the impeller 220 is installed in the internal space defined when the upper housing 210 and the lower housing 240 are assembled together. In addition, relevant functions of a controller which was configured separately in the prior art are incorporated in the circuit board body 230 within the blower 110.

Figure 4:
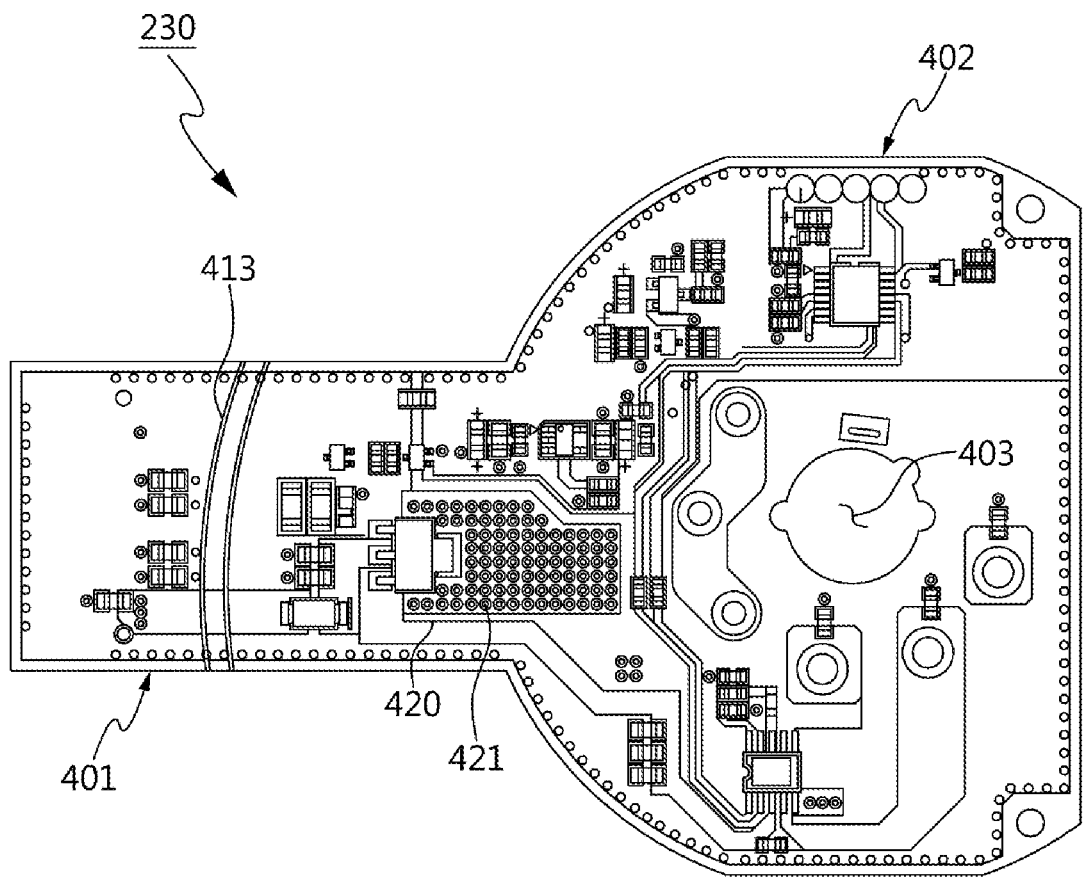
FIG. 4 is a plan view of a circuit board body shown in FIG. 2.

FIG. 4 is a plan view of the circuit board body 230 shown in FIG. 2. Referring to FIG. 4, the circuit board body 230 has a round bottomed flask shape. Accordingly, the circuit board body 230 includes an extension portion 401 and a substrate portion 402 which is formed integrally with the extension portion 401 and to be assembled to the lower housing 240.

The exothermic element 231 is mounted on the extension portion 401 which is out of the substrate portion 402. In addition, the exothermic element 231 is disposed at a position which is out of the blades 222 of the impeller 220 even when the impeller 220 is assembled on the substrate portion 402. Therefore, this embodiment has a configuration that heat dissipation generated in the exothermic element 231 is cooled directly in the circuit board body 230. The exothermic element 231 may be a specific element of which heat dissipation is highest (i.e., most severe) among electronic elements installed on the circuit board body 230. Here, since experimental values and the like of electronic elements are acquired and provided in advance prior to mounting the elements, such a specific exothermic element can be designated using the experimental values obtained.

Further, an area of the circuit board body 230 can be calculated by calculating an amount of heat dissipation generated by the exothermic element 231. In other words, it can be calculated based on characteristic values and using a current value of the exothermic element because the heat dissipation amount of the exothermic element 231 corresponds to electric power consumption in the element. The characteristic values of the exothermic element include turn-on resistance and forward voltage. These characteristic values can also be obtained using data provided by electronic element manufacturers.

Further, a heat dissipation pattern 420 for cooling heat dissipation of the exothermic element 231 is formed on the top surface of the circuit board body 230. The reason is that as the exothermic element 231 is disposed outside the region of the impeller 220 because cooling effect is lowered when heat dissipation generated by the exothermic element 231 flows toward the vehicle seat by the impeller 220, the heat dissipation pattern 420 is configured in order for the circuit board body 230 itself to perform cooling.

In addition, this embodiment is configured such that cooling is performed by the heat dissipation pattern itself by forming a sufficiently large heat dissipation pattern 420 for the exothermic element 231 mounted on the circuit board. Further, this embodiment is characterized in that the exothermic element to be mounted on the circuit board is disposed between the housing and the impeller so that heat generated by the exothermic element is cooled down by wind generated by operation of the impeller.

The area of the heat radiation pattern 420 corresponds to heat transfer performance values depending on the kind of the circuit board to be used, which can be configured depending on heat dissipation amount of the exothermic element 231.

Further, a plurality of plating holes 421 are arranged in the heat dissipation pattern 420. The plating may be gold plating. The plating holes 421 in the heat radiation pattern 420 are included in the area of the heat radiation pattern 420. Therefore, the area of each plating hole 421 is calculated by multiplying diameter of the plating hole 421 by thickness of the circuit board body 230 (that is, thickness of the circuit board).

Further, a through hole 403 corresponding to the hollow hole 232-1 of the motor assembly 232 is formed on the substrate portion 402. As a result, the column portion 241 formed on the lower housing 240 can be inserted into the through hole 403 and the hollow hole 232-1.

It is noted that the upper housing 210 and the lower housing 240 are separately shown in the drawings but this is to facilitate understanding and that the upper housing 210 and the lower housing 240 may be referred to as a first housing and a second housing. Further, shape of each of the upper housing 210 and the lower housing 240 may be reversed depending on design.

Figure 5:
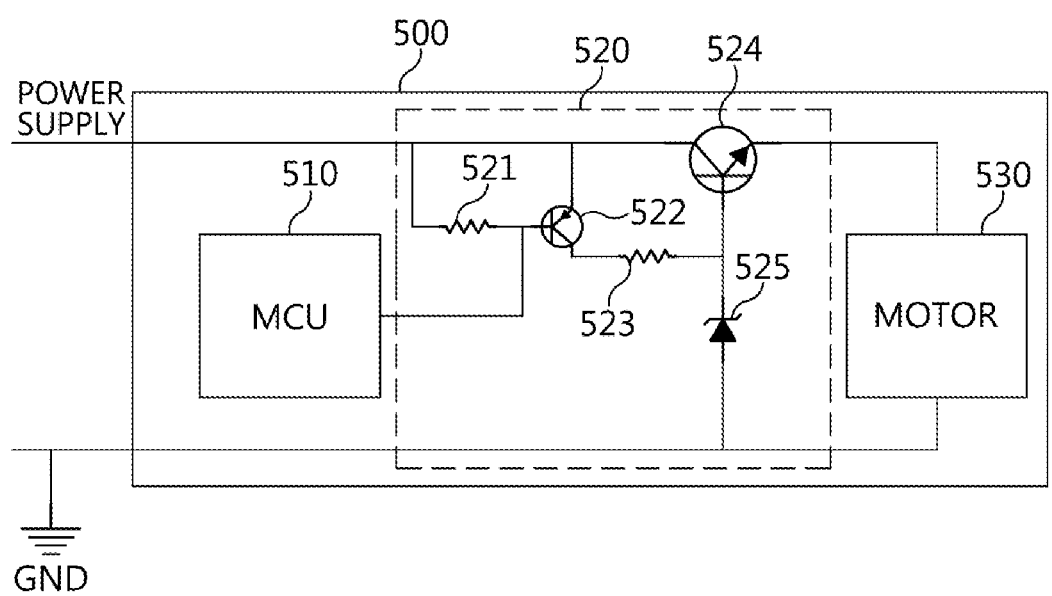
FIG. 5 is a conceptual diagram of a control circuit of the blower shown in FIG. 1.

FIG. 5 is a conceptual diagram of the control circuit 500 of the blower shown in FIG. 1. Referring to FIG. 5, the control circuit 500 of the blower comprises a microcontroller unit 510 for receiving user's input and generating control commands, a motor 530, a motor control circuit 520 for controlling the motor in response to the control command, and the like.

In addition, the microcontroller unit 510 generates an on/off signal of the blower in response to switch input by the user or a signal from a host controller. A small signal switch 522 is turned on when difference in voltage level between a base and an emitter of the small signal switch 522 becomes higher than VBE(ON) due to voltage generated by the corresponding signal.

When the small signal switch 522 is turned on, a current path is generated that leads to the small signal switch 522, a resistor 523 and a large current switch 524. This embodiment is configured such that when the large current switch 524 is turned on, voltage and current are supplied to the motor 530 whereby the blower is turned on.

At this time, base voltage of the large current switch 524 is fixed depending on Zener voltage of a Zener diode 350 and voltage obtained by subtracting VBE voltage (voltage between a base and an emitter) of the large current switch 524 from the Zener voltage is output to the motor 530 as it is fixed. On the other hand, this embodiment comprises the resistor 521 for voltage bias of the small signal switch 522.

Further, the small signal switch 522 serves to control turning on/off the base voltage of the large current switch 524.

The resistor 523 serves to limit the voltage bias and current of the large current switch 524. The large current switch 524 is turned on/off in response to the base input current and in turn turns on/off a motor power supply. Further, a Zener diode 350 cuts off the base input voltage of the large current switch 524 by the Zener voltage.

Further, as shown in FIG. 5, a single large current switch element is used to perform motor power regulation and power on/off control simultaneously. In addition, the microcontroller unit 510 may be composed of a microprocessor, a microcomputer, an electronic circuit, or the like.

Figure 6:
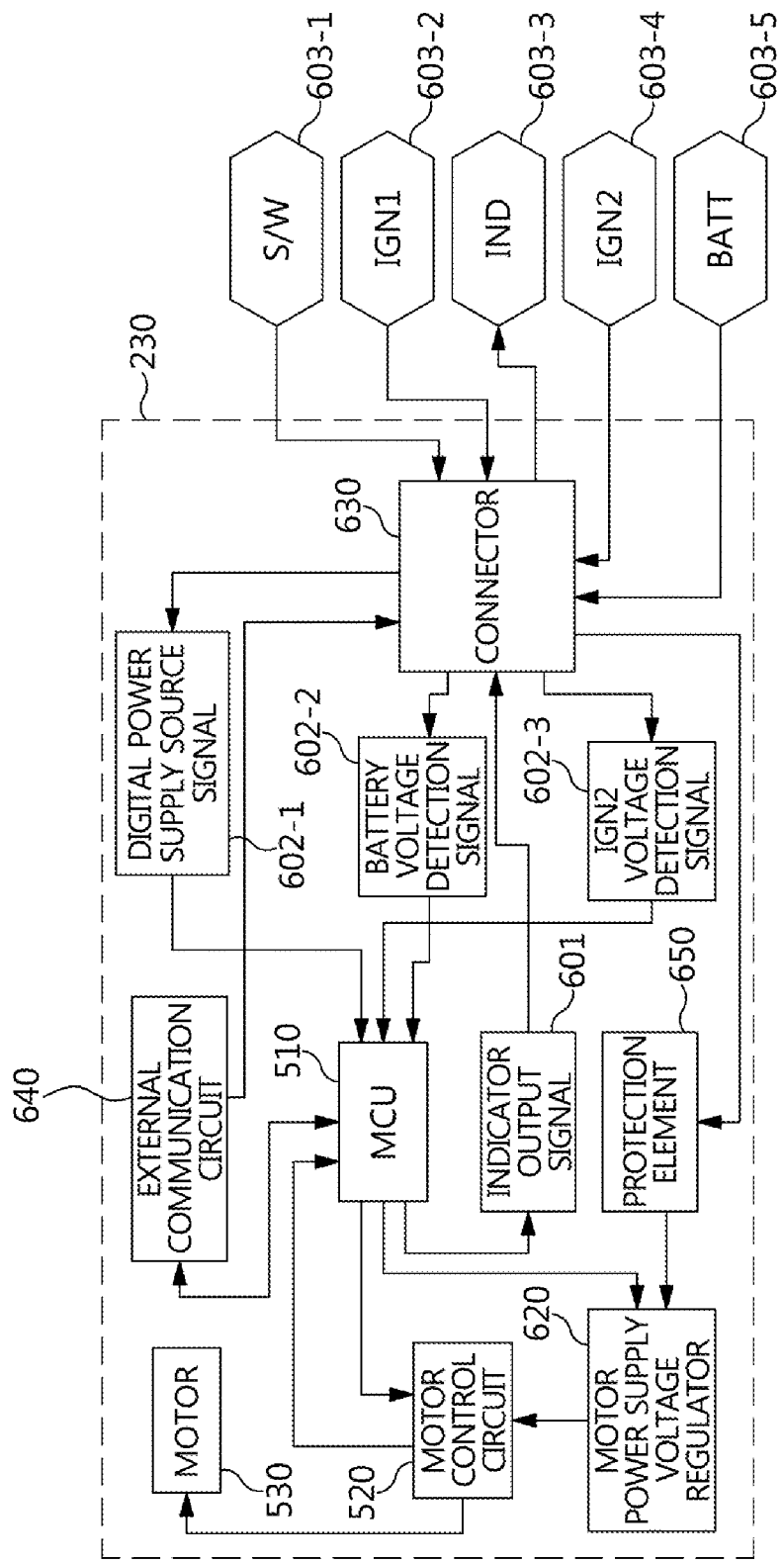
FIG. 6 is block diagram of a circuit of the seat ventilation system for a vehicle shown in FIG. 1.

FIG. 6 is block diagram of a circuit of the seat ventilation system for a vehicle shown in FIG. 1. Referring to FIG. 6, the circuit board body 230 is connected to a switch input signal 603-1, starting power signals 603-2 and 603-4 and the like through a connector 630. It is natural that the circuit board body is also connected to the microcontroller unit 510 for overall control of components constituted on the circuit board body 230, an external communication circuit 640 for communication with an external device, a protection element 650 for filtering voltage and protecting from overvoltage and a battery 603-5 for actuating a motor power supply voltage regulator 620 that supplies power to the motor 530 and the like.

The starting power signals 603-2 and 603-4 are composed of an Ignition 1 (IGN1) signal which is meant by a power supply signal directly required for starting and running and an Ignition 2 (IGN2) signal which is meant by a power supply signal having no direct influence on running.

The microcontroller unit 510 receives a digital power supply source signal 602-1, a battery voltage detection signal 602-2 and a starting voltage detection signal 602-3 through the connector 630. In addition, the microcontroller unit 510 outputs an indicator output signal 601 resulting from driving of the motor 530 to an indicator 603-3 through the connector 630. In addition, a vehicle controller monitors an operating state the motor and an input state and, if there is a problem in information being monitored, executes fail safety operation suitable to the situation. The vehicle controller may be an electronic control unit (ECU), a hybrid control unit (HCU), a vehicle control unit (VCU), or the like. To this end, the vehicle controller may be composed of a microprocessor, an electronic circuit, a memory device and the like. The memory may be a flash memory type, a random access memory (RAM), a static random access memory (SRAM), a read only memory (ROM), an electrically erasable programmable read only memory (EEPROM), a programmable read only memory (PROM), a magnetic memory, or the like.

Figure 7:
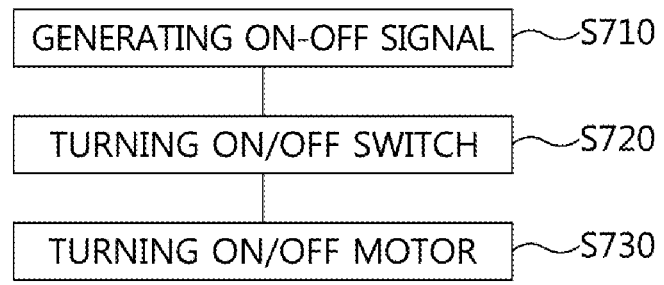
FIG. 7 is a flowchart showing a control process of a blower according to an embodiment of the present disclosure.

FIG. 7 is a flowchart showing control process of the blower according to an embodiment of the present disclosure. Referring to FIG. 7, an on-off signal is generated to control operation of the blower in step S710. Such an on-off signal can be made via a hardware-type switch or a software-type switch.

Then, turning on/off the switch is executed in the motor control circuit (reference numeral 520 in FIG. 5) in step S720.

Thereafter, the motor 530 is turned on/off depending on the control for turning on/off the switch.

Further, steps of a method or algorithm described in connection with embodiments disclosed herein may be implemented in a form of programmed commands, which may be executed through a variety of computer means such as a microprocessor, a processor, a central processing unit (CPU) or the like, and recorded in computer readable media. The computer readable media may contain programmed (commands) codes, data files, data architectures and the like alone, or in combination with each other.

The programmed (commands) codes recorded on the media may be those designed and configured specially for embodiments of the present disclosure or may be available to those skilled in the art of computer software. Examples of the computer readable media include magnetic media such as hard disks, floppy disks and magnetic tape; optical media such as CD-ROMs, DVDs, Blu-ray and the like; and semiconductor memory devices specially configured to store and execute programmed (commands) codes, such as ROM, RAM, flash memory and the like.

Here, examples of programmed (commands) codes include machine language codes such as those produced by a compiler as well as high-level language codes that can be executed by a computer using an interpreter or the like. The hardware devices as described above may be configured to operate as one or more software modules so as to perform actions in embodiments of the present disclosure, and vice versa.

Although the present disclosure has been described in the foregoing with reference to the drawings illustrated by way of example, the present disclosure is not limited to the disclosed embodiments, and it will be apparent to those of ordinary skill in the art that various modifications and variations can be made to the present disclosure without departing from the spirit and scope of the disclosure. Therefore, such modifications or variations fall within the scope of the present disclosure as claimed and the scope of the present disclosure should be interpreted based on the appended claims.

What is claimed is:

1. A seat ventilation blower comprising:
a first housing;
a second housing coupled and assembled to the first housing;
an impeller inserted inside the first housing or the second housing, the impeller configured to rotate;
a circuit board body having a motor assembly coupled to the impeller to rotate the impeller, wherein the circuit board body is configured to control operation of the motor assembly and is installed in an interior space formed when the first and second housings are coupled and assembled together;
wherein an exothermic element mounted on the circuit board body is arranged between an inner side of an edge of the first housing or the second housing and a position out of a range of blades of the impeller to be cooled by air flow generated from the rotation of the impeller;
a cover formed to protrude from a lateral side of the first housing; and
a recessed channel formed to protrude from a lateral side of the second housing;
wherein a terminal portion of the circuit body is positioned within the recessed channel; and
wherein the cover covers a rear portion of the terminal portion and a top portion of the terminal portion such that foreign matter is prevented from flowing into the impeller through the recessed channel.

2. The seat ventilation blower according to claim 1, wherein a heat dissipation pattern for cooling heat dissipation of the exothermic element is formed on one side or both sides of the circuit board body.

3. The seat ventilation blower according to claim 2, wherein the heat dissipation pattern is formed with at least one plating hole.

4. The seat ventilation blower according to claim 3, wherein a total area of the plating hole is calculated based on a diameter of the plating hole and a thickness of the circuit board body.

5. The seat ventilation blower according to claim 2, wherein an area of the heat dissipation pattern is calculated based on a heat transfer performance value set in advance depending on a type of a circuit board of the circuit board body.

6. The seat ventilation blower according to claim 1, wherein the exothermic element is a specific electronic element of which a heat dissipation amount to be preset is highest among electronic elements installed on the circuit board body.

7. The seat ventilation blower according to claim 1, wherein an air intake port for sucking air is formed on a top side of the first housing or the second housing.

8. The seat ventilation blower according to claim 1, wherein a plurality of air discharge ports for discharging air are formed on a lateral side of the first housing or the second housing.

9. The seat ventilation blower according to claim 1, wherein a column portion for fixing the circuit board body is formed on a center of the first housing or the second housing.

10. The seat ventilation blower according to claim 9, wherein the column portion is formed with a catching projection having a stepped portion for fixing the circuit board body at a predetermined height.

11. The seat ventilation blower according to claim 1, wherein the impeller is provided with an annular ring and a disk plate which are arranged in parallel, and wherein a plurality of blades are arranged to be inclined at a predetermined interval with respect to each other around a rotating shaft and between the annular ring and the disk plate.

12. The seat ventilation blower according to claim 1, wherein the circuit board body comprises:
   a microcontroller unit for generating an on/off control signal in an input signal to control turning on/off a motor of the motor assembly; and
   a motor control circuit for turning on/off the motor in response to the on/off control signal.

13. The seat ventilation blower according to claim 12, wherein the motor control circuit comprises a single large current switch element for turning on/off a motor power supply for supplying power to the motor.

14. The seat ventilation blower according to claim 13, wherein the motor control circuit comprises a small signal switch for turning on/off electric current to be input to a base of the large current switch element.

15. The seat ventilation blower according to claim 13, wherein the motor control circuit comprises a Zener diode for cutting off voltage to be input to a base of the large current switch element to generate Zener voltage.

16. The seat ventilation blower according to claim 15, wherein the motor power supply is of voltage equal to value obtained by subtracting voltage of the large current switch element from the Zener voltage.

17. The seat ventilation blower according to claim 1, wherein the first housing and the second housing are assembled and fixed by a bolting.

18. A seat ventilation system for a vehicle, comprising:
   an on-off switch;
   a seat ventilation blower according to claim 1;
   a front duct installed at a front end of the seat ventilation blower; and
      a back duct installed at a rear end of the seat ventilation blower.

* * * * *